(12) United States Patent
Muelders (10) Patent No.: US 11,430,931 B2
(45) Date of Patent: Aug. 30, 2022

(54) CIRCUIT ASSEMBLY

(71) Applicant: Lumileds LLC, San Jose, CA (US)

(72) Inventor: Barbara Muelders, Aachen (DE)

(73) Assignee: Lumileds LLC, San Jose, CA (US)

( * ) Notice: Subject to any disclaimer, the term of this patent is extended or adjusted under 35 U.S.C. 154(b) by 115 days.

(21) Appl. No.: 16/656,265

(22) Filed: Oct. 17, 2019

(65) Prior Publication Data
US 2020/0127182 A1    Apr. 23, 2020

(30) Foreign Application Priority Data

Oct. 17, 2018    (EP) .................................... 18200984

(51) Int. Cl.
| | |
|---|---|
| H01L 33/62 | (2010.01) |
| H01L 21/48 | (2006.01) |
| H01L 23/498 | (2006.01) |
| H01L 23/538 | (2006.01) |
| H01L 23/00 | (2006.01) |
| H01L 25/075 | (2006.01) |

(52) U.S. Cl.
CPC ............ *H01L 33/62* (2013.01); *H01L 21/486* (2013.01); *H01L 21/4853* (2013.01); *H01L 23/49811* (2013.01); *H01L 23/49866* (2013.01); *H01L 23/5384* (2013.01); *H01L 23/5386* (2013.01); *H01L 23/562* (2013.01); *H01L 25/0753* (2013.01)

(58) Field of Classification Search
CPC ... H01L 33/62; H01L 21/4853; H01L 21/486; H01L 23/49811; H01L 23/49866; H01L 23/5384; H01L 23/5386; H01L 23/562; H01L 25/0753

USPC .......................................................... 257/88
See application file for complete search history.

(56) References Cited

U.S. PATENT DOCUMENTS

| | | | | |
|---|---|---|---|---|
| 2004/0207094 | A1* | 10/2004 | Sugizaki | ........... H01L 23/49816 257/774 |
| 2005/0230826 | A1* | 10/2005 | Tanaka | .................... H01L 24/29 257/737 |
| 2008/0217784 | A1* | 9/2008 | Binder | .................... H01L 24/33 257/762 |

(Continued)

FOREIGN PATENT DOCUMENTS

| | | |
|---|---|---|
| JP | 04-152590 | 5/1992 |
| JP | 2007-273835 | 10/2007 |

OTHER PUBLICATIONS

English Machine Translation of JP 2007/273835 (Year: 2007).*
JEDEC—Global Standards for the Microelectronics Industry, Temperature Cycling—JESD22-A104E (Oct. 2014).

*Primary Examiner* — Dzung Tran
(74) *Attorney, Agent, or Firm* — Volpe Koenig (57) ABSTRACT

The invention describes a circuit assembly comprising a circuit board with a metal core, a pattern of conductive tracks, and a dielectric layer between the metal core and the conductive tracks; at least one circuit component mounted to the circuit board by means of solder interconnects, wherein a solder interconnect is formed between a contact pad of the circuit component and a conductive track; characterized in that the metal core comprises at least one cavity, wherein a cavity is arranged in the vicinity of a solder interconnect. The invention further describes a circuit board for such a circuit assembly, and a method of manufacturing such a circuit assembly.

19 Claims, 5 Drawing Sheets

(56) References Cited

U.S. PATENT DOCUMENTS

| | | | |
|---|---|---|---|
| 2010/0022054 A1* | 1/2010 | Ueda | H01L 21/4857 438/126 |
| 2012/0119341 A1* | 5/2012 | Warren | H01L 21/4828 257/675 |
| 2014/0117539 A1* | 5/2014 | Karasawa | H01L 23/49822 257/737 |
| 2019/0074196 A1* | 3/2019 | Yu | H01L 23/3121 |

* cited by examiner

PRIOR ART

CIRCUIT ASSEMBLY

FIELD OF INVENTION

The invention describes a circuit assembly, and a method of manufacturing such a circuit assembly.

BACKGROUND

A circuit component is generally soldered to a carrier such as a printed circuit board (PCB). Solder provides a good electrical connection and continues to be used, also for mounting very small components such as surface mount devices (SMD) to PCBs. The leads or legs extending from a packaged component or integrated circuit can be connected to the PCB by very small beads of solder, for example in a reflow solder procedure.

However, differences in thermal behaviour of the different materials used in various parts of the design can contribute to early failure of the circuit. For example, there can be a significantly high thermal expansion mismatch between the metal core of a PCB, a ceramic carrier of a multi-chip LED array, the sapphire substrate of an LED, etc. This can be a problem, especially when a component repeatedly heats up (and expands) during operation and then cools down (and contracts). The different expansion and contraction rates during thermal cycling result in significant forces acting on a solder bond or interconnect between board and component, placing the interconnect layer in a high stress state. This can lead to plastic strain in the interconnect layer, i.e. to some degree of deformation, which can result in the development of microscopic cracks in the solder material. Such "micro-failures" can grow during further thermal cycles, and may ultimately lead to fatigue failure of one or more solder bonds, which effectively means entire or catastrophic failure of the circuit.

Generally, a system comprising electric and electronic components soldered onto a PCB is subject to exhaustive temperature cycle testing in order to determine its ability to resist temperature extremes. Such temperature cycle testing can follow an industry standard, for example JEDEC JESD22-A104. A customer can specify the minimum number of thermal cycles that must be endured by a system before failure, and the manufacturer must comply with the specification.

Therefore, to ensure that a system will pass a temperature cycle test, it is necessary to take some measures to avoid the development of failures in the solder interconnect. For example, measures can be taken to reduce the thermal mismatch between the metals used in the various parts of the system. In the case of a single-layer insulated metal substrate (IMS) or a single-layer metal core PCB (MCPCB), this means choosing a metal such as copper for the substrate or core. Alternatively, a ceramic-inlay board can be used when a component is provided on a ceramic carrier. However, these design choices result in significant additional costs.

Therefore, it is an object of the invention to provide a more economical way of reducing stresses in a solder interconnect of such a system.

SUMMARY

The object of the invention is achieved by the circuit assembly of claim 1; and by the method of claim 11 of manufacturing a circuit assembly.

According to the invention, the circuit assembly comprises a circuit board with a metal core, a pattern of conductive tracks, and a dielectric layer between the metal core and the conductive tracks; and at least one circuit component mounted to the circuit board by means of solder interconnects, wherein a solder interconnect is formed between a contact pad of the circuit component and a conductive track. The inventive circuit assembly is characterized in that the metal core comprises at least one cavity, wherein a cavity is formed underneath a solder interconnect, as a blind hole with the shape of a right cylinder.

The circuit assembly can be referred to as a metal core PCB (MCPCB) system, since it comprises one or more circuit components mounted on a metal core PCB. As described above, plastic strain arising from a mismatch in the coefficients of thermal expansion in an MCPCB system can lead to failure of the circuit. An advantage of the inventive circuit assembly is that such plastic strain in the solder interconnect can be significantly reduced. The terms "solder interconnect" and "solder bond" are synonymous and may be used interchangeably herein. The inventors have seen that by forming one or more cavities in the metal core at a position underneath a solder bond, the solder bond is subject to less plastic strain. This is because a cavity leads to a stress redistribution, reducing the stresses arising from different thermal expansions of the various materials at critical locations where stress maxima would otherwise lead to crack initiation/and or crack growth. Since the cavities lead to such a significant reduction in stress at the solder bond, it is possible to consider alternatives to the expensive metal cores required by the prior art MCPCB systems. The inventive MCPCB can be realised in a very cost-effective manner, since it allows a cheap and easily available metal such as aluminium to be used for the metal core.

As explained above, a cavity in the shape of a right cylinder or "blind hole" is formed underneath a future solder bond. This may be understood to mean that a cavity can be formed to lie underneath a solder bond of the circuit assembly, for example a cavity can be formed directly underneath the (future) position of a solder bond; however the position of another cavity may equally well be offset from the position of a solder bond depending on various parameters such as cavity depth, cavity diameter, distance between cavities, etc.

According to the invention, the method of manufacturing such a circuit assembly comprises the steps of providing a metal core for a circuit board; forming a number of blind holes in the metal core, wherein the position of a blind hole is chosen on the basis of the position of a future or planned solder interconnect; applying a dielectric layer onto the metal core; forming a pattern of conductive tracks on the dielectric layer; and forming a solder interconnect between a contact pad of a circuit component and a corresponding conductive track.

The inventive method provides a favourably cheap solution to the problems outlined above, since the step of forming cavities in the metal core is straightforward and can be done using readily available milling or drilling tools. This step can be carried out at any point prior to the step of applying the dielectric layer, and does not require clean room conditions. The cavities could be formed in a random manner in the metal core, or might be arranged in a predefined pattern. This approach may be sufficient to result in one or more cavities with positions in the vicinity of solder interconnects. Preferably, however, the position of a cavity is chosen so that the cavity will certainly be in the vicinity of a solder interconnect. To achieve this, all that is required is some knowledge of the positions of future solder interconnects that will be used to bond one or more circuit components onto conductive tracks formed on the board. Once the cavities have been formed, the metal core can be prepared in the usual manner for subsequent lamination of the dielectric. This is followed by lamination of a copper layer and then photolithographic etching to form the conductive track pattern.

The dependent claims and the following description disclose particularly advantageous embodiments and features of the invention. Features of the embodiments may be combined as appropriate. Features described in the context of one claim category can apply equally to another claim category.

In a metal core PCB, the terms "core" or "base" refer to the metal plate that gives structural stability to an MCPCB as well as providing efficient thermal dissipation. A metal core is essentially a flat rectangular metal plate. As explained above, it is usually necessary to use a copper core because of the issues associated with mismatch between coefficients of thermal expansion. For the inventive MCPCB, it is possible to use a metal that has a high coefficient of thermal expansion, for example aluminium, which also has the advantage of being relatively cheap and easy to machine. Therefore, without restricting the invention in any way, it may be assumed in the following that the core is made of aluminium. The thickness of the metal core may be in the order of 1.5 mm, for example. Of course, a metal core can have any suitable thickness, depending on various factors such as the type of metal used, the desired rate of heat dissipation, etc.

While it is known from the prior art to used blind holes in a multi-level PCB, the cavities or blind holes of the inventive MCPCB serve an entirely different purpose. In a multi-level PCB, blind holes are formed through a dielectric layer of the PCB to electrically connect metal tracks at different levels. In the inventive MCPCB, a cavity or blind hole is not part of the electrical circuitry. Instead, it serves to absorb thermal stresses arising from expansion or contraction of the relatively thick metal core. Any blind hole formed in the metal core of the inventive MCPCB is hidden from the rest of the system by the uninterrupted dielectric layer that is applied over the core before depositing the copper layer from which the conductive tracks will be formed.

A cavity can be formed in any number of ways and may have any suitable shape. For example, a cavity can be formed by milling a recess or pit into the surface of the metal core. Preferably, a cavity is formed by drilling a cylindrical bore into the metal core. In a particularly preferred embodiment of the invention, a cavity is formed as a right cylindrical bore extending through the body of the metal core, i.e. from the "top" surface (onto which the dielectric will be applied) through to the bottom surface. In such an embodiment, the longitudinal axis of a blind hole is essentially perpendicular to a main surface of the essentially rectangular flat metal core.

A cavity can be left "empty" without any negative effect. However, it may be preferred to fill some or all of the cavities with a suitable thermally conductive material before applying the dielectric layer. Therefore, in a preferred embodiment of the invention, a cavity is at least partially filled with a material that has favourably high thermal conductivity, and also a favourably low coefficient of thermal expansion. For example, a cavity may be filled with a type of thermal grease that is used to overcome surface roughness, e.g. graphite-based thermal grease. Any step of filling cavities with such a material is preferably performed after circuit components have been soldered to the circuit board.

Preferably, the metal core is prepared to comprise at least one cavity or blind hole underneath each solder interconnect. The contact area of a solder bond can typically be in the order of 0.1-3.0 mm$^2$. In a particularly preferred embodiment of the invention, the cross-sectional area of a cavity underneath such a solder bond is at most 2.5 mm$^2$. In a further preferred embodiment of the invention, the cross-sectional area of a cavity is at least 0.05 mm$^2$. In a preferred embodiment of the invention, a single blind hole is provided underneath each solder bond, and a blind hole is preferably formed so that it will be positioned at the centre of the region that will lie underneath the solder bond.

In some embodiments, a single blind hole may be sufficient to ensure a favourable mitigation of the effects of thermal expansion, i.e. to reduce the strain at the solder interconnection. Equally, if dimensions are very small, it may not be practicable to form more than one blind hole underneath a solder bond. However, in a MCPCB system with suitable dimensions, it may be preferable to provide more than one blind hole underneath a solder bond. For example, it may be beneficial to provide a 2×2 or a 3×3 array of very small blind holes underneath a solder bond.

An MCPCB system is usually preferred when the circuit components require efficient heat dissipation. In a preferred embodiment of the invention, a circuit component comprises a semiconductor package with a number of LED dies mounted on a ceramic carrier or tile. In such an embodiment, solder interconnects are formed between contact pads of the ceramic carrier and conductive tracks of the circuit board.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE PREFERRED EMBODIMENT(S)

Figure 1:
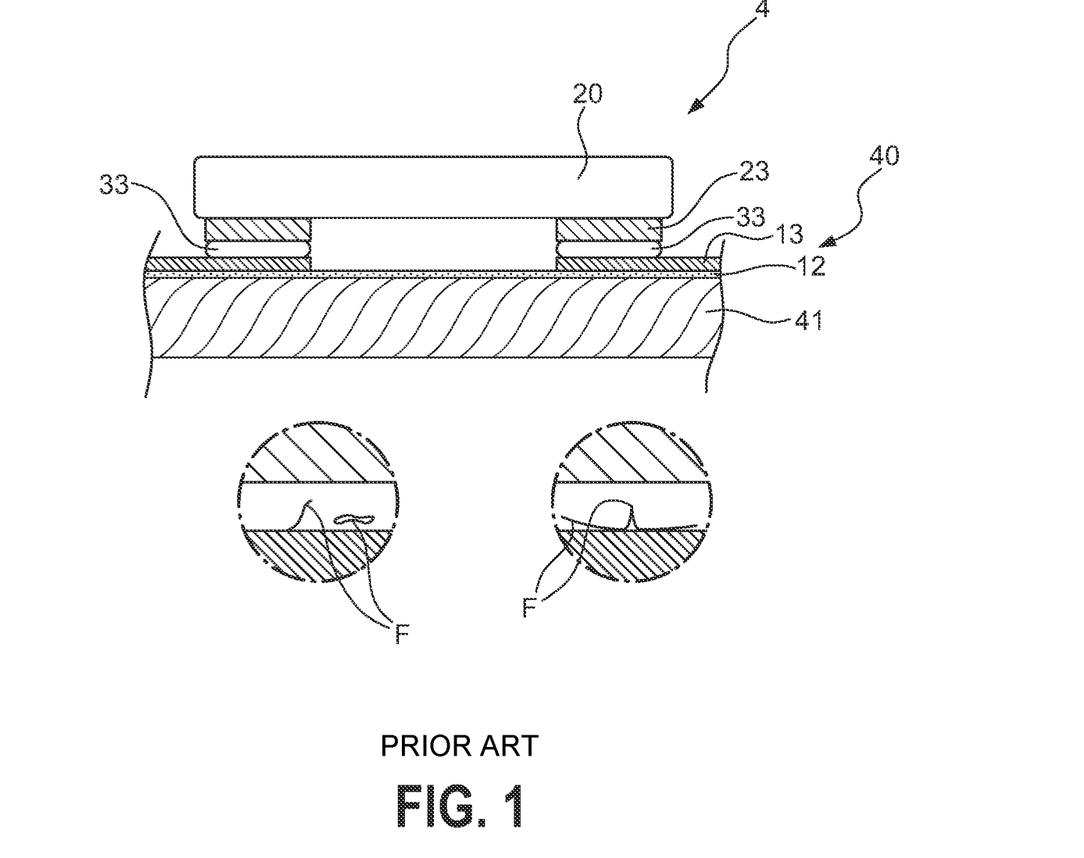
FIG. 1 shows a cross-section through a prior art MCPCB system.

FIG. 1 shows a cross-section through a prior art MCPCB system 4. Here, a circuit component 20 is soldered to a MCPCB 40 by means of solder bonds 33. The MCPCB 40 comprises a metal core 41 or base layer 41 to which an electrically insulating dielectric layer 12 is applied. In a photolithography procedure, copper tracks 13 are etched from a copper layer deposited on the dielectric 12. A solder bond 33 is formed between contact pads 23 of the component 20 and corresponding tracks 13 of the MCPCB 40. When there is significant mismatch between the coefficients of thermal expansion of the metal core 41 and other relevant parts of the system 4, micro-failures F can develop as shown in the enlarged regions of the diagram. Eventually, such micro-failures F can lead to complete detachment of a solder bond 33 from a contact surface 13, 23 resulting in failure of the circuit. For this reason, such a prior art MCPCB system 4 or circuit assembly is generally provided with a metal core 41 which has a relatively low coefficient of thermal expansion, for example a copper core. However, the volume of metal required for such a core 41 is considerable, so that the cost of a copper core can be significant.

Figure 2:
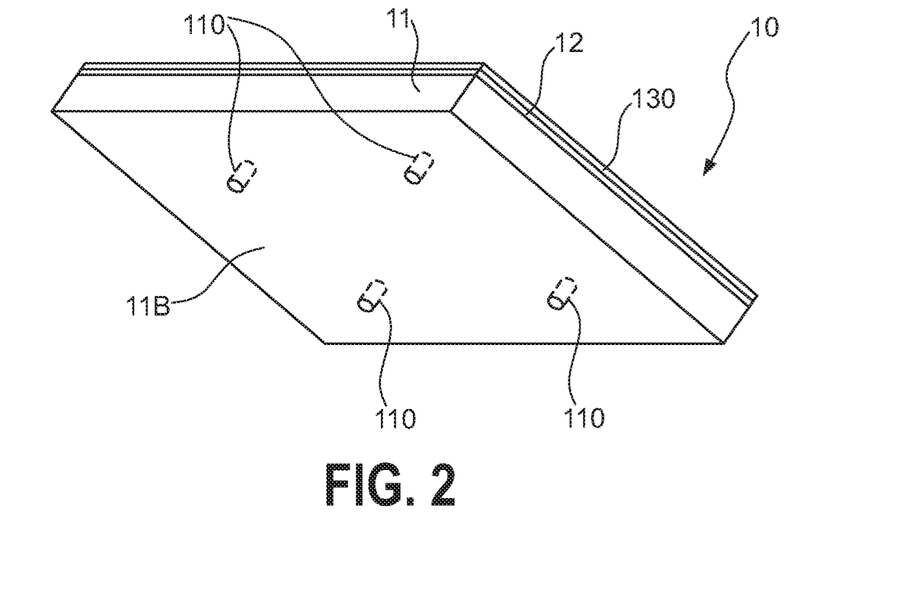
FIG. 2 shows a perspective view of a metal core PCB for an embodiment of the inventive circuit assembly.

FIG. 2 shows a metal core PCB 10 that can counteract the unwanted effects of thermal mismatch, even if the base layer 11 or core 11 is made from a relatively metal with a large coefficient of thermal expansion, for example aluminium. The diagram shows a perspective view from below, indicating the bottom surface 11B of the metal core 11, a dielectric layer 12 and a copper layer 120 (from which the conductive tracks will be etched). To compensate for the mismatch between the coefficients of thermal expansion of the aluminium core 11 and other relevant parts of the circuit, the core 11 is provided with a number of cavities 110. In this exemplary embodiment, a cavity 110 is drilled into the base layer 11 from below, at a position that will later be underneath a solder bond.

Figure 3:
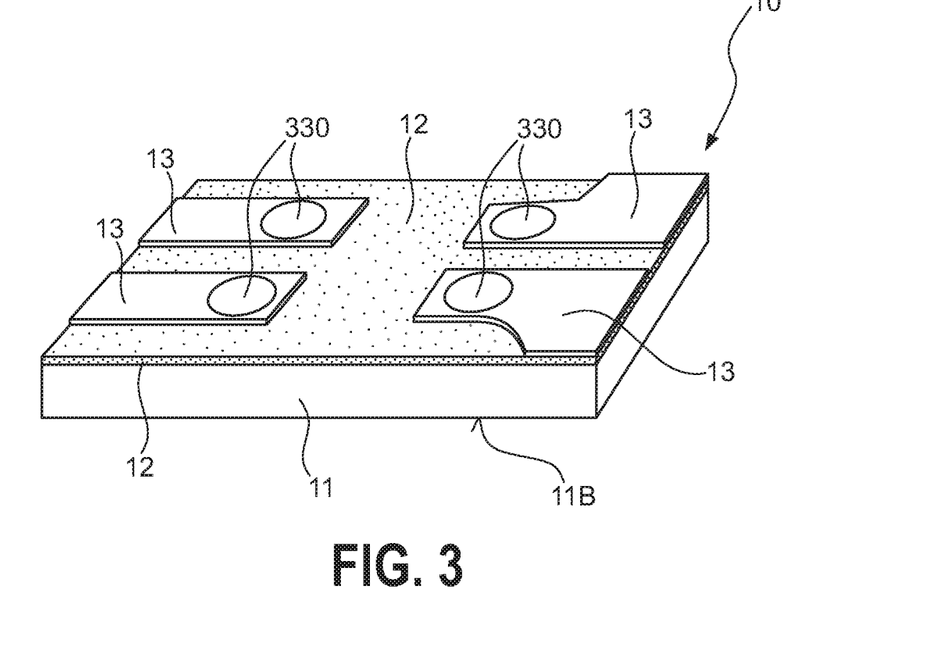
FIG. 3 shows another perspective view of the metal core PCB of FIG. 2.

FIG. 3 shows a perspective view from above, indicating the metal core 11, the dielectric layer 12 and conductive tracks 13 etched from the copper layer 130 of FIG. 2. The positions of the future solder bonds are also shown. These will be formed on dedicated interconnect regions 330 or bond regions 330 of the tracks 13. In this exemplary embodiment, each solder bond will be positioned over a blind hole 110 formed in the metal core 11.

Figure 4:
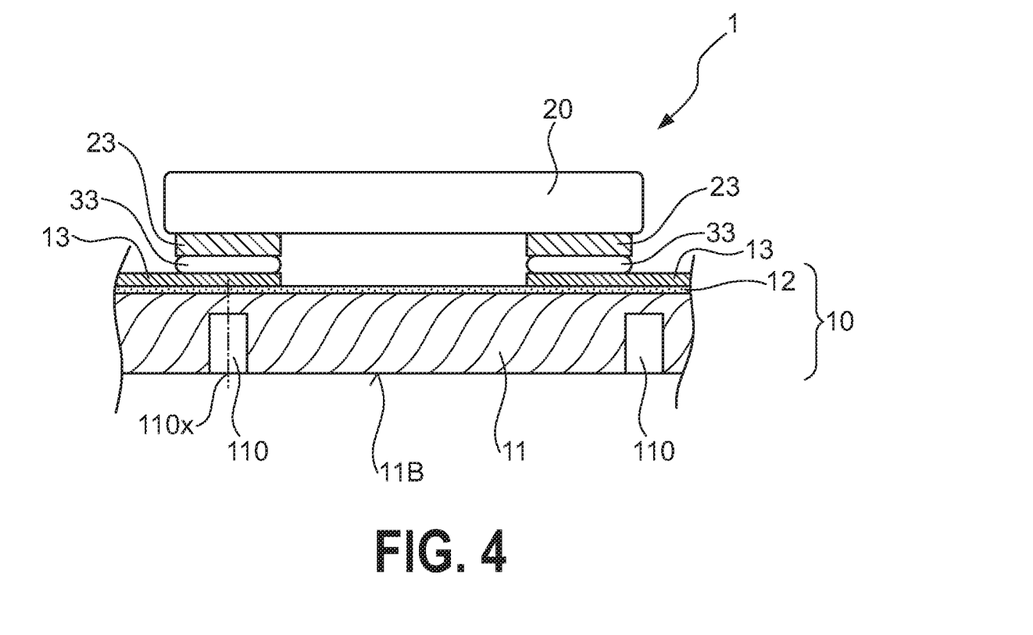
FIG. 4 shows a cross-section through an embodiment of the inventive circuit assembly.

FIG. 4 shows a cross-section of an embodiment of an MCPCB system 1 according to the invention, similar to the system 4 of FIG. 1, but using an MCPCB 10 of the type described in FIGS. 2 and 3, i.e. a PCB with a metal core 11 made of aluminium, which is a favourably cheap metal but which is characterized by a relatively high coefficient of thermal expansion. Here also, a circuit component 20 is soldered to the MCPCB 10 by means of solder bonds 33. It is the aim of the invention to increase the number of thermal cycles that can be endured by such an MCPCB system or circuit assembly without failure, i.e. the aim of the invention is to avoid the development of failures in the solder bonds 33. The diagram shows solder bonds 33 and blind holes 110 formed in the aluminium core 11. The left-hand blind hole 110 is arranged to lie directly underneath the corresponding solder bond 33, while the right-hand blind-hole 110 is offset from the corresponding solder bond 33. When the component 20 is operational and very hot, the effects of the resulting thermal expansion of the aluminium core 11 are mitigated by the presence of the blind holes 110. The result is to reduce the stresses on the solder bonds 33, so that fatigue-related damage to the solder bonds 33 can be postponed or even avoided altogether.

Figure 5:
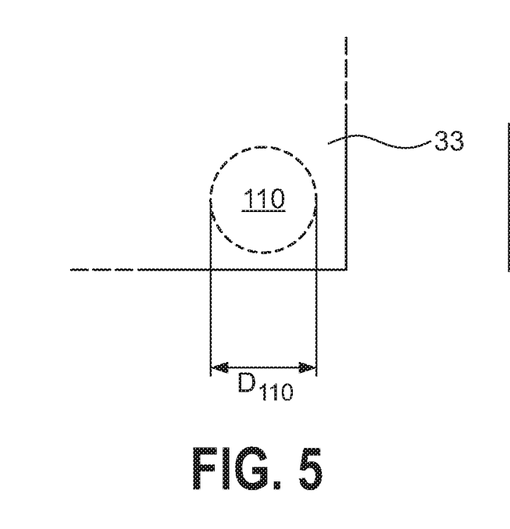
FIG. 5 shows a solder interconnect and blind hole arrangement in an embodiment of the inventive circuit assembly.

FIG. 5 shows a view through a solder bond 33 and a blind hole 110, showing exemplary dimensions. Here, a single blind hole 110 has been formed in the core at a position underneath the solder bond 33. The area covered by the solder bond 33 can be about 1.5 mm2, for example, and the blind hole 110 can be drilled to a diameter D110 of about 0.4 mm, giving a circular cross-section area of about 0.12 mm2.

Figure 6:
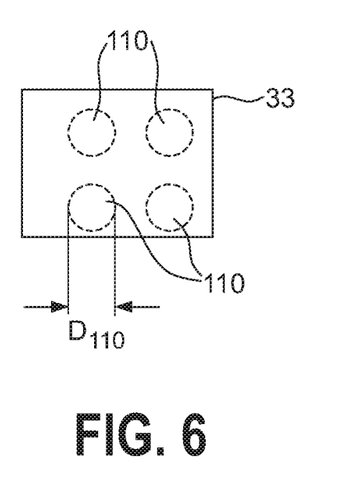
FIG. 6 shows a solder interconnect and blind hole arrangement in an embodiment of the inventive circuit assembly.

FIG. 6 shows an array of four blind holes 110 that can be drilled in the core. The blind holes 110 can lie underneath a solder bond 33 as shown in FIG. 5. Equally, one or more of the blind holes 110 can be offset from the position of the solder bond. The diameters of the blind holes 110 can be chosen accordingly.

Figure 7:
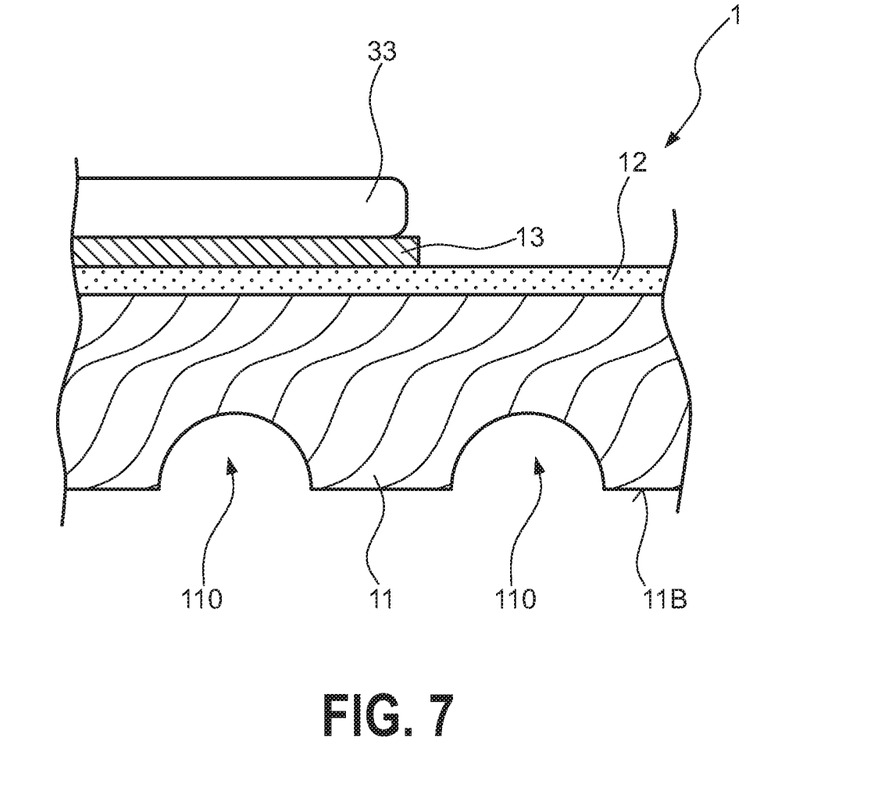
FIG. 7 shows a partial cross-section through an alternative embodiment of the inventive circuit assembly.

FIG. 7 shows a partial cross-section through a further alternative embodiment of the inventive circuit assembly. Here, several cavities 110 are formed in the lower surface 11B of the metal core 11. Here, each cavity 110 is formed as a pit or recess in the lower face 11B of the metal core 11.

Figure 8:
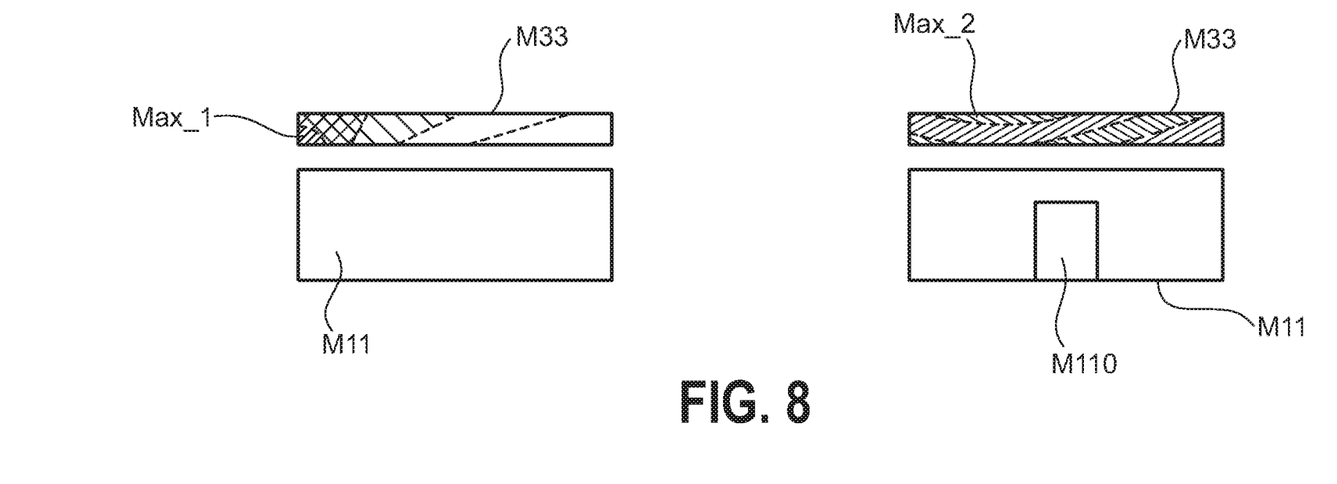
FIG. 8 illustrates simulation results for TCT testing of a prior art circuit assembly and a circuit assembly according to the invention.

FIG. 8 illustrates simulation results for TCT testing of a prior art MCPCB system (on the left of the diagram) and an MCPCB system according to the invention (on the right of the diagram). In each case, an MCPCB with an aluminium core was modelled, having the same relevant dimensions such as thickness, to simulate the effect of thermal cycling on a solder bond. The diagram shows an aluminium core model M11 and a solder bond model M33. It may be assumed that the simulation considers parameters relevant to a dielectric layer and a conductive track between the core M11 and the solder bond M33. On the left, the metal core M11 is modelled as a solid plate, i.e. without any blind hole underneath a solder bond. On the right, a blind hole M110 is modelled in the metal core, in the vicinity of the solder bond.

The diagram shows regions of plastic strain distribution in the solder bond after a series of thermal cycles was simulated. A maximum equivalent plastic strain Max_1 in the order of 15% was predicted at a lower outer region 91 of the solder bond M33 on the left-hand side of the diagram. A plastic strain of such magnitude will lead to the development of a micro-failure within a relatively low number of thermal cycles. This is in keeping with observations made with actual test systems, in which micro-failures in the solder bond of such an MCPCB have been observed after 500 thermal cycles.

On the right-hand side of the diagram, a maximum equivalent plastic strain Max_2 in the order of only 4% was predicted at an upper region 92 of the solder bond M33. This is significantly lower when compared with the configuration on the left-hand side of the diagram, and illustrates the beneficial effect of providing a blind hole M110 in the vicinity of the solder bond M33. By reducing the plastic strain in the solder bond M33, it is possible to increase the number of thermal cycles that can be endured before failure, i.e. it is possible to obtain an MCPCB system with a favourably long lifetime.

Although the present invention has been disclosed in the form of preferred embodiments and variations thereon, it will be understood that numerous additional modifications and variations could be made thereto without departing from the scope of the invention. For example, instead of a cylindrical bore with a circular cross-section, a cavity can have any suitable form in which the cross-sectional shape is square, rectangular, star-shaped etc. A cavity can be formed using any suitable manufacturing method such as stamping, drilling etching, etc.

For the sake of clarity, it is to be understood that the use of "a" or "an" throughout this application does not exclude a plurality, and "comprising" does not exclude other steps or elements.

REFERENCE SIGNS circuit assembly 1
circuit board 10 metal core 11
bottom surface 11B
blind hole 110
longitudinal axis 110X
dielectric layer 12
conductive tracks 13
circuit component 20
contact pad 23
solder interconnects 33
prior art MCPCB system 4
MCPCB 40
metal core 41
maximum strain Max_1, Max_2

What is claimed is:

1. A device comprising:
    a circuit board comprising:
        a metal core comprising a flat rectangular metal plate and at least two blind holes having a right cylindrical shape,
        a pattern of conductive tracks, and
        a dielectric layer between the metal core and the conductive tracks;
    at least one circuit component adjacent the circuit board and comprising at least two contact pads; each contact pad including a respective corresponding solder bond interconnecting the corresponding contact pad of the circuit component and a respective corresponding one of the conductive tracks of the circuit board, wherein each respective corresponding solder bond is aligned with a respective corresponding one of the at least two blind holes of the metal core.

2. The device according to claim 1, wherein the metal core and the dielectric layer meet at an interface, and each of the at least one two blind holes has a longitudinal axis that is essentially perpendicular to the horizontal plane of the interface.

3. The device according to claim 1, wherein each of the at least two blind holes is disposed directly under a respective corresponding one of the solder bonds.

4. The device according to claim 1, wherein the metal core is made of aluminum.

5. The device according to claim 1, wherein at least one of the at least two blind holes has a maximum cross-sectional area of 2.5 mm2.

6. The device according to claim 1, wherein at least one of the at least two blind holes has a minimum cross-sectional area of 0.05 mm2.

7. The device according to claim 1, wherein at least one of the at least two blind holes is disposed directly under the corresponding solder bond.

8. The device according to claim 1, wherein at least one of the at least two blind holes extends partially through the metal core from a lower surface of the metal core towards the dielectric layer.

9. The device according to claim 1, wherein the at least one circuit component further comprises a plurality of LEDs on a ceramic carrier.

10. A circuit board comprising:
    a metal core comprising a flat rectangular metal plate and at least one two blind holes having a right cylindrical shape;
    a dielectric layer on a surface of the metal core; and
    a pattern of conductive tracks on the dielectric layer, each of the conductive tracks comprising a respective corresponding interconnect region, each respective corresponding interconnect region disposed over a respective corresponding one of the at least two blind holes of the metal core.

11. The circuit board of claim 10, wherein the metal core and the dielectric layer intersect at a horizontally planar interface, and each of the at least two blind holes has a longitudinal axis that is essentially perpendicular to a horizontal plane of the horizontally planar interface.

12. The circuit board of claim 10, wherein at least one of the at least two blind holes is aligned directly under a corresponding solder interconnect region.

13. The circuit board of claim 10, wherein the metal core is made of aluminum.

14. The circuit board of claim 10, wherein each of the at least one blind holes is disposed directly under a corresponding solder interconnect.

15. The circuit board of claim 10, wherein at least one of the at least two blind holes extends partially through the metal core from a lower surface of the metal core towards the dielectric layer.

16. The device according to claim 1, wherein at least one of the at least two blind holes is un-filled.

17. The device according to claim 1, wherein at least one of the at least two blind holes is filled with a thermal grease.

18. The circuit board according to claim 10, wherein at least one of the at least two blind holes is un-filled.

19. The circuit board according to claim 10, wherein at least one of the at least two blind holes is filled with a thermal grease.

* * * * *